US012235428B2

United States Patent
Haase et al.

(10) Patent No.: US 12,235,428 B2
(45) Date of Patent: Feb. 25, 2025

(54) METHOD, COMPUTER PROGRAM PRODUCT, COMPUTER-READABLE MEDIUM AND SYSTEM FOR SCANNING PARTIAL REGIONS OF A SAMPLE USING A SCANNING MICROSCOPE

(71) Applicant: Carl Zeiss Microscopy GmbH, Jena (DE)

(72) Inventors: Daniel Haase, Zoellnitz (DE); Manuel Amthor, Jena (DE)

(73) Assignee: Carl Zeiss Microscopy GmbH, Jena (DE)

( * ) Notice: Subject to any disclaimer, the term of this patent is extended or adjusted under 35 U.S.C. 154(b) by 204 days.

(21) Appl. No.: 17/059,343

(22) PCT Filed: May 29, 2019

(86) PCT No.: PCT/EP2019/064023
§ 371 (c)(1),
(2) Date: Nov. 27, 2020

(87) PCT Pub. No.: WO2019/229151
PCT Pub. Date: Dec. 5, 2019

(65) Prior Publication Data
US 2021/0239952 A1    Aug. 5, 2021

(30) Foreign Application Priority Data
May 30, 2018    (DE) .................... 10 2018 113 014.7

(51) Int. Cl.
*G02B 21/00*    (2006.01)
*G02B 21/36*    (2006.01)
(Continued)

(52) U.S. Cl.
CPC ......... *G02B 21/008* (2013.01); *G02B 21/367* (2013.01); *G06N 3/084* (2013.01); *H01J 37/222* (2013.01)

(58) Field of Classification Search
CPC .................. G02B 21/367; G06N 3/084; G06T 2207/20081; G06T 2207/20084; G06T 2207/10061; H01J 2237/226
See application file for complete search history.

(56) References Cited

U.S. PATENT DOCUMENTS 9,939,381 B1    4/2018  Kimmel et al.
11,120,968 B2 *  9/2021  Hujsak .................. H01J 37/244
(Continued)

FOREIGN PATENT DOCUMENTS

DE    10 2015 114 015    3/2017

OTHER PUBLICATIONS

Godaliyadda et al. "A framework for dynamic image sampling based on supervised learning." IEEE Transactions on Computational Imaging, vol. 4, No. 1, Mar. 2018 (Year: 2018).*
(Continued)

*Primary Examiner* — Boubacar Abdou Tchoussou
(74) *Attorney, Agent, or Firm* — Grüneberg and Myers PLLC

(57) ABSTRACT

A method is useful for scanning partial regions of a sample by a scanning microscope, such as a laser scanning microscope or a scanning electron microscope, and for reconstructing an overall image of the sample from data of the scanned partial regions of the sample. The method includes: 1) determining partial regions of the sample, which are scanned by the scanning microscope, by a machine learning system which is trained by supervised learning, unsupervised learning, and/or reinforcement learning for improved determination of the partial regions of the sample which are
(Continued)

scanned by the scanning microscope; 2) scanning the determined partial regions of the sample by the scanning microscope; and 3) reconstructing the overall image of the sample from the data of the scanned partial regions of the sample, wherein non-scanned partial regions of the sample are estimated by the data of the scanned partial regions of the sample.

19 Claims, 5 Drawing Sheets

(51) Int. Cl.
    *G06N 3/084*     (2023.01)
    *H01J 37/22*     (2006.01)

(56) References Cited

U.S. PATENT DOCUMENTS

| | | | |
|---|---|---|---|
| 2014/0060372 A1 | 3/2014 | Yamaguchi et al. | |
| 2014/0247973 A1* | 9/2014 | Moussavi | G06K 9/6277 |
| | | | 382/133 |
| 2015/0371815 A1 | 12/2015 | Potocek et al. | |
| 2017/0103532 A1* | 4/2017 | Ghesu | G06T 7/70 |
| 2017/0109650 A1 | 4/2017 | Cevher et al. | |
| 2017/0213355 A1* | 7/2017 | Hujsak | G06T 5/005 |
| 2018/0189610 A1 | 7/2018 | Kandemir et al. | |
| 2020/0321188 A1* | 10/2020 | Hujsak | G01N 23/2251 |

OTHER PUBLICATIONS

International Search Report issued Dec. 4, 2019 in PCT/EP2019/064023, with English translation, 9 pages.
Written Opinion issued Dec. 4, 2019 in PCT/EP2019/064023, with English translation, 15 pages.
Dahmen et al., "*Feature Adaptive Sampling for Scanning Electron Microscope*," Sci. Rep. 6, 25350, May 6, 2016, pp. 1-11.
Godaliyadda et al., "*A Supervised Learning Approach for Dynamic Sampling*," Society for Imaging Science and Technology, IS&T International Symposium on Electronic Imaging 2016, COIMG-0153.1-0153.8, 8 pages.
Gözcü et al., "*Learning-Based Compressive MRI*," IEEE Transactions on Medical Imaging, arXiv:1805.01266v1 [eess.IV] May 3, 2018, pp. 1-13.
Wikipedia, Compressed sensing, https://en.wikipedia.org/wiki/Compressed_sensing, Retrieved from the internet on Nov. 24, 2020, 14 pages.
Xing et al., "*Robust Nucleus/Cell Detection and Segmentation in Digital Pathology and Microscopy Images: A Comprehensive Review*," IFEE Rev Biomed Eng. Author manuscript; available in PMC Jan. 12, 2017, 69 pages.
Xing et al., "*Robust Nucleus/Cell Detection and Segmentation in Digital Pathology and Microscopy Images: A Comprehensive Review*," IFEE Rev Biomed Eng. 2016; 9:234-263, 31 pages.
Zhang et al., "*Dynamic Sparse Sampling for Confocal Raman Microscopy*," Anal. Chem. 2018, 90, 4461-4469.

\* cited by examiner

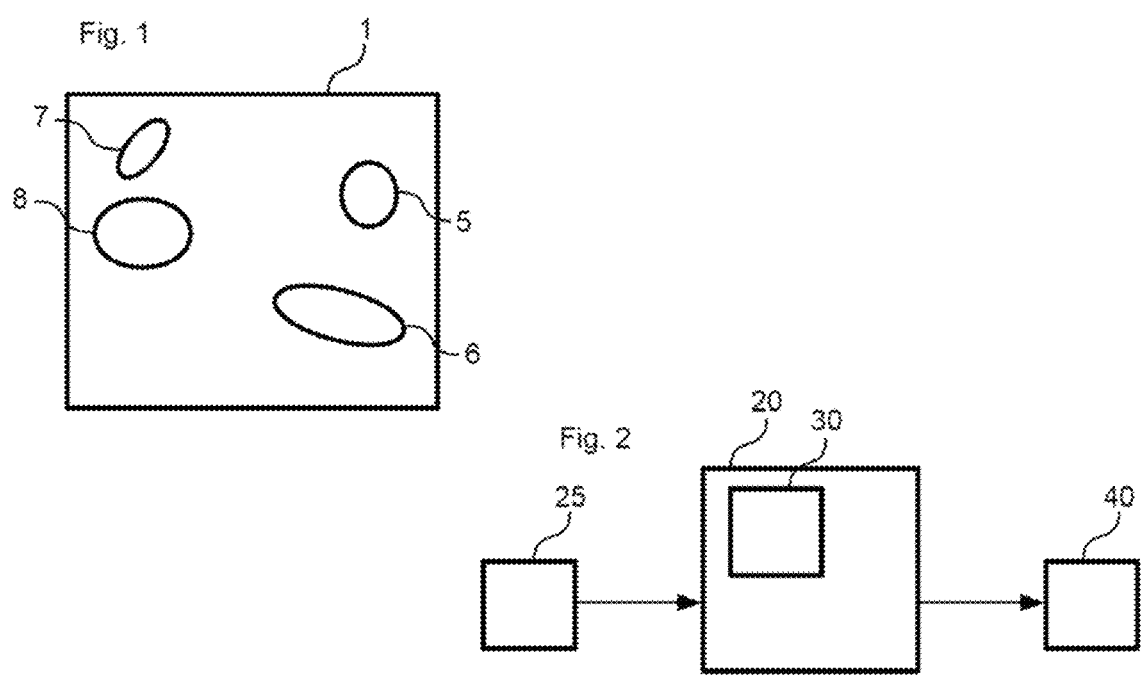

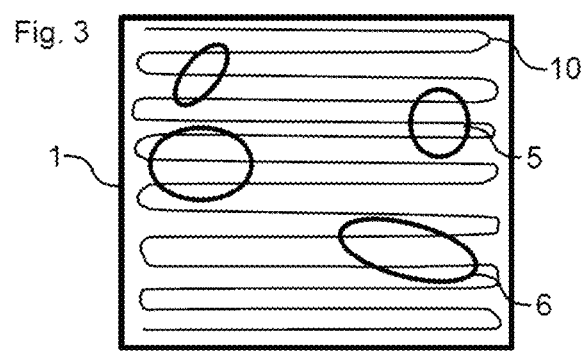
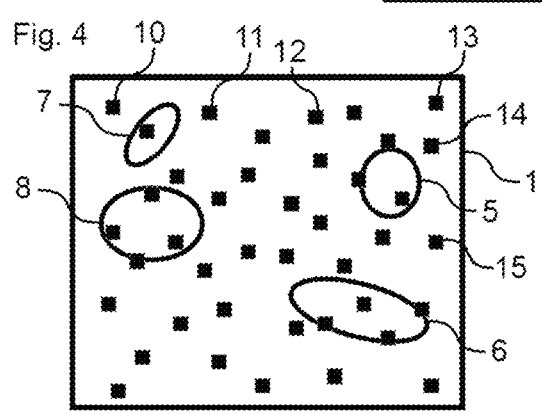 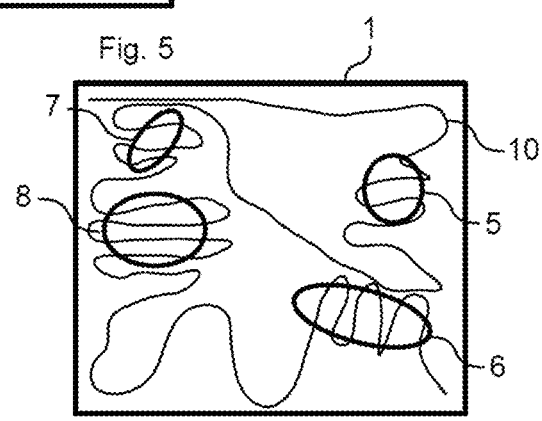

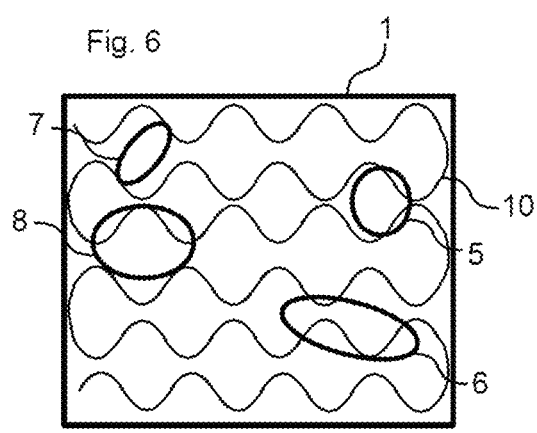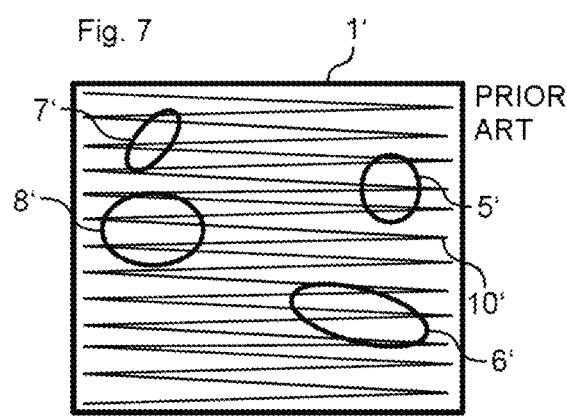

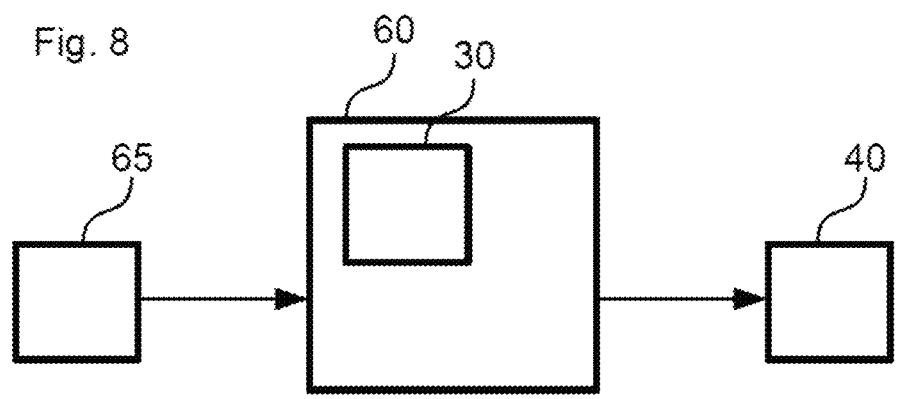
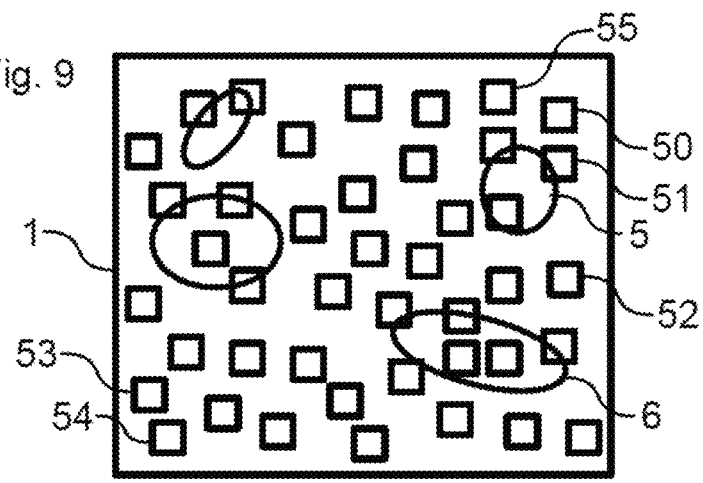

METHOD, COMPUTER PROGRAM PRODUCT, COMPUTER-READABLE MEDIUM AND SYSTEM FOR SCANNING PARTIAL REGIONS OF A SAMPLE USING A SCANNING MICROSCOPE

CROSS-REFERENCE TO RELATED APPLICATIONS

This application is the National Stage entry under § 371 of International Application No. PCT/EP2019%064023 filed on May 29, 2019, and which claims the benefit of German Application No. 10 2018 113 014.7, filed on May 30, 2018. The content of each of these applications is hereby incorporated by reference in its entirety.

BACKGROUND OF THE INVENTION

Field of the Invention

The invention relates to a plurality of methods for scanning partial regions of a sample by means of a scanning microscope, a plurality of computer program products, a plurality of computer-readable media, a plurality of systems for scanning partial regions of a sample by means of a scanning microscope, a plurality of methods for capturing partial regions of a sample by means of a microscope and a plurality of systems for capturing partial regions of a sample.

Description of Related Art

In previously known microscope systems, the imaging of which is based on the scanning of a sample 1', e.g. a laser scanning microscope (LSM) or a scanning electron microscope (SEM), an image is generated by a sample region being completely scanned point by point (or else e.g. line by line). FIG. 7 shows such complete scanning line by line of a sample 1' comprising four elements 5'-8', wherein the sample 1' is situated on a carrier, in accordance with the prior art. The complete scan of the sample 1' then yields an overall image of the sample. The spacing of the linear partial regions is illustrated in an exaggerated way in FIG. 7 for illustration reasons. In reality the spacing of the lines is significantly smaller or almost zero since the sample 1' is completely scanned.

Another possibility is for an overall image of a sample to be converted by means of the microscope by a procedure in which a sample is not scanned completely, but rather sparsely, i.e. a scan pattern stipulates which partial regions of the sample are scanned, and the complete image is subsequently reconstructed from the data of the scanned partial regions of the sample (so-called "compressed sensing"). This increases the recording speed and reduces the radiation exposure of the sample.

The suitability of a scan pattern is greatly dependent on the respective microscope system, on the purpose of use of the overall image, the sample, etc. In addition, it is important for the scan pattern to enable a good or accurate reconstruction of the overall image of the sample, i.e. for the reconstructed overall image to correspond as well as possible to a completely scanned overall image of the sample. Therefore, there is not usually a generally valid "best scan pattern", rather the latter is always adapted to the conditions in the optimum case.

The reconstruction of an overall image of the sample from the sparsely scanned data points is generally an underdetermined problem, that is to say that a plurality of plausible solutions exist. This problem is circumvented mathematically by means of regularization, for example, that is to say by further constraints being imposed on the solution.

The solution of both problems (determination of the scan pattern and the reconstruction of the overall image of the sample) is a complex task in each case and is generally greatly dependent on the respective conditions (microscope, sample, purpose of use of the overall image, . . . ). It should be assumed that after a certain learning phase a user is able to deduce or to determine good scan patterns from the conditions. Equally, a user familiar with sample and microscope can often "guess" very well missing parts of an overall image of the sample from the respective context or the scanned partial regions. The reconstruction of the overall image is often carried out by means of traditional optimization.

What is disadvantageous about that is that the determination of the scan pattern or of the partial regions to be scanned of the sample and the reconstruction of the overall image are performed manually and persons or users with an appropriate amount of experience are needed for that. Therefore, the determination of the scan patterns and respectively the reconstruction of the overall image of the sample are very time-consuming and cannot be carried out in an automated manner. What is disadvantageous about the traditional optimization of the reconstruction of the overall image is that no context information is included and, consequently, the overall image is not reconstructed optimally.

SUMMARY OF THE INVENTION

The present invention is based on the object of disclosing a method and respectively a device and respectively a system which make it possible to determine partial regions of the sample which are to be scanned in an automated manner for a scanning microscope, and make it possible to reconstruct the overall image of the sample from the scanned partial regions of the sample.

This object is respectively achieved by means of a method as described below, a computer program product as described below, a computer-readable medium as described below, and a system as described below.

BRIEF DESCRIPTION OF THE DRAWINGS

FIG. 1 shows a sample comprising four elements, wherein the sample is situated on a carrier.

FIG. 2 shows a schematic illustration of one embodiment of the system.

FIG. 3 shows a first scan pattern of the sample from FIG. 1 in accordance with one embodiment of the method.

FIG. 4 shows a second scan pattern of the sample from FIG. 1 in accordance with one embodiment of the method.

FIG. 5 shows a third scan pattern of the sample from FIG. 1 in accordance with one embodiment of the method.

FIG. 6 shows a fourth scan pattern of the sample from FIG. 1 in accordance with one embodiment of the method.

FIG. 7 shows complete scanning point by point of a sample comprising four elements, wherein the sample is situated on a carrier, in accordance with the related art.

FIG. 8 shows a schematic illustration of a further embodiment of the system.

FIG. 9 shows a fifth capture pattern of the sample from FIG. 1 in accordance with one embodiment of the method.

DETAILED DESCRIPTION OF THE INVENTION

Figure 10:
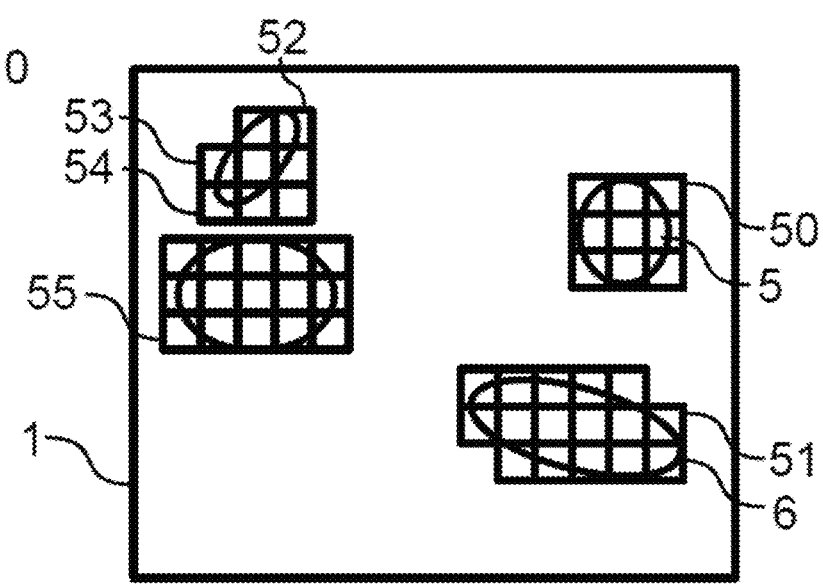
FIG. 10 shows a sixth capture pattern of the sample from FIG. 1 in accordance with one embodiment of the method.

In particular, the object is achieved by means of a first method for scanning partial regions of a sample by means of a scanning microscope, in particular by means of a laser scanning microscope or by means of a scanning electron microscope, and for reconstructing an overall image of the sample from data of the scanned partial regions of the sample, wherein the method comprises the following steps:—determining the partial regions of the sample which are scanned by the scanning microscope, in particular the partial regions of the sample and the order in which the partial regions of the sample are scanned, by means of a machine learning system, wherein the machine learning system is trained by means of supervised learning, unsupervised learning, in particular on the basis of an autoencoder, and/or reinforcement learning for improved determination of the partial regions of the sample which are scanned by the scanning microscope; —scanning the determined partial regions of the sample by means of the scanning microscope; and—reconstructing the overall image of the sample from the data of the scanned partial regions of the sample, wherein non-scanned partial regions of the sample are estimated of means of the data of the scanned partial regions of the sample.

One advantage of this is that the partial regions of the sample which are scanned by the scanning microscope are determined in an automated manner by means of a trained machine learning system. By means of the trained machine learning system, particularly efficient scan patterns, i.e. which partial regions of the sample are scanned, are determined rapidly and in a technically simple manner. The particularly efficient scan patterns may be distinguished for example by a short time required for scanning, by a particularly precise or accurate reconstruction of the overall image of the sample, a particularly low radiation exposure of the sample during the scanning of the partial regions, or similar properties. In the case of this method, once training has taken place, human or manual intervention by a user or human being is not required. A further advantage is that overall images having a particularly high quality or exactness are reconstructed.

In particular, the object is also achieved by means of a second method for scanning partial regions of a sample by means of a scanning microscope, in particular by means of a laser scanning microscope or by means of a scanning electron microscope, and for reconstructing an overall image of the sample from data of the scanned partial regions of the sample, in particular as described above, wherein the method comprises the following steps: —determining the partial regions of the sample which are scanned by the scanning microscope, in particular the partial regions of the sample and the order in which the partial regions of the sample are scanned; —scanning the partial regions of the sample by means of the scanning microscope; —inputting the data of the scanned partial regions into a machine learning system; and—reconstructing the overall image of the sample from the data of the scanned partial regions of the sample by means of the machine learning system, wherein non-scanned partial regions of the sample are estimated of means of the data of the scanned partial regions of the sample by the machine learning system, wherein the machine learning system is trained by means of supervised learning, unsupervised learning, in particular on the basis of an autoencoder, and/or a reinforcement learning for improved reconstruction of the reconstructed overall image of the sample from the data of the scanned partial regions of the sample.

One advantage of this is that the overall image of the sample is reconstructed in an automated manner by means of a trained machine learning system. By means of the trained machine learning system, the reconstructed overall image is determined rapidly and in a technically simple manner. In addition, the reconstructed overall image is determined particularly precisely by the machine learning system, i.e. corresponds as well as possible to an overall scan or complete scan of the sample. In the case of this method, once training has taken place, human or manual intervention by a user or human being is not required.

In particular, the object is also achieved by means of a computer program product having instructions which are readable by a processor of a computer and which, when they are executed by the processor, cause the processor to carry out the method mentioned above.

In particular, the object is also achieved by means of a computer-readable medium, on which the computer program product program is stored.

In particular, the object is also achieved by means of a system for scanning partial regions of a sample by means of a scanning microscope, in particular by means of a laser scanning microscope or by means of a scanning electron microscope, and for reconstructing an overall image of the sample from data of the scanned partial regions of the sample, wherein the system is configured for estimating non-scanned partial regions of the sample by means of the data of the scanned partial regions of the sample, wherein the system comprises a machine learning system which, by means of supervised learning, unsupervised learning, in particular on the the basis of an autoencoder, and/or reinforcement learning, is trained to carry out the following:—determining the partial regions of the sample which are scanned by the scanning microscope, in particular the partial regions of the sample and the order in which the partial regions of the sample are scanned, by means of the machine learning system.

One advantage of this is that the partial regions of the sample which are scanned by the scanning microscope are determined in an automated manner by means of a trained machine learning system. By means of the trained machine learning system, particularly efficient scan patterns, i.e. which partial regions of the sample are scanned, are determined rapidly and in a technically simple manner. The particularly efficient scan patterns may be distinguished for example by a short time required for scanning, by a particularly precise or accurate reconstruction of the overall image of the sample, a particularly low radiation exposure of the sample during the scanning of the partial regions, or similar properties. In the case of this system, once training has taken place, human or manual intervention by a user or human being is not required. A further advantage is that the system reconstructs overall images having a particularly high quality or exactness.

In particular, the object is also achieved by means of a system for scanning partial regions of a sample by means of a scanning microscope, in particular by means of a laser scanning microscope or by means of a scanning electron microscope, and for reconstructing an overall image of the sample from data of the scanned partial regions of the sample, in particular a system having the features of the system mentioned above wherein the system comprises a machine learning system which, by means of supervised learning, unsupervised learning, in particular on the the basis of an autoencoder, and/or reinforcement learning, is trained to carry out the following:—reconstructing the overall image of the sample from the data of the scanned partial regions of the sample by means of the machine learning system, wherein non-scanned partial regions of the sample are estimated by means of the data of the scanned partial regions of the sample by the machine learning system.

One advantage of this is that the system reconstructs the overall image of the sample in an automated manner by means of a trained machine learning system. By means of the trained machine learning system, the reconstructed overall image is determined rapidly and in a technically simple manner. In addition, the reconstructed overall image is determined particularly precisely by the machine learning system, i.e. corresponds as well as possible to an overall scan or complete scan of the sample. In the case of this system, once training has taken place, human or manual intervention by a user or human being is not required. A further advantage is that overall images having a particularly high quality or exactness are reconstructed.

In accordance with one embodiment of the first method, the method furthermore comprises the following steps for training the machine learning system by means of reinforcement learning: inputting one or more figures of merit, for example the total time expenditure for scanning the partial regions and/or the total radiation exposure of the sample during the scanning of the partial regions of the sample and/or the quality of the reconstructed overall image of the sample, into the machine learning system; and varying the partial regions of the sample which are scanned and/or the order in which the partial regions of the sample are scanned in order to achieve a figure of merit that is as optimal as possible or figures of merit that are as optimal as possible. What is advantageous about this is that the machine learning system is trained rapidly and in a technically simple manner by means of reinforcement learning in order to determine a scan pattern that is as optimal as possible. An optimal scan pattern can be, in particular, a scan pattern which enables the overall image of the sample to be reconstructed as exactly or precisely as possible with a short time duration for scanning with the least possible radiation exposure of the sample while scanning. In particular, in the case of reinforcement learning, in each step it is possible to allocate a reward or punishment with regard to the figure of merit to be minimized or to be maximized (time duration of the scan, radiation exposure, quality or exactness of the reconstruction of the overall image), in particular in an automated manner. Varying the partial regions can be carried out by means of a scanning microscope or can be carried out by simulation of the scanning of partial regions on the basis of an overall image.

In accordance with one embodiment of the first method, the method furthermore comprises the following step: inputting information about the sample, e.g. the number of elements of the sample, the size of the elements of the sample and/or the type of sample, and/or about the scanning microscope and/or about the purpose of use of the reconstructed overall image into the machine learning system for improved determination of the partial regions of the sample which are scanned by the scanning microscope, inputting the information enables the partial regions which are scanned by the scanning microscope to be determined even better or more efficiently. The machine learning system can determine the partial regions better on account of the information that is input (so-called context information). In particular, as a result of the information being input, the machine learning system does not have to proceed from completely unknown scanned data of the partial regions which are used for reconstructing the overall image. The machine learning system can assume, in particular, that the data of the partial regions do not consist of completely random information or data.

In accordance with one embodiment of the first method, before the partial regions of the sample are scanned, an overview image of the sample is input into the machine learning system for improved determination of the partial regions which are scanned by the scanning microscope. As a result, the machine learning system can identify partial regions of the sample which have a particularly high information density (e.g. edges of elements, partial regions in which elements are present, etc.) already before the partial regions are determined. An even more efficient scan pattern can thus be determined by the machine learning system.

In accordance with one embodiment of the first method, the method furthermore comprises the following steps for training the machine learning system by means of unsupervised learning: inputting non-reconstructed overall images of samples into the machine learning system; and determining the partial regions of the sample which have a particularly high information density on the basis of the respective non-reconstructed overall image by means of an autoencoder for improved determination of the partial regions of the sample which are scanned by the scanning microscope. What is advantageous about this is that there is no need to input scanned partial regions of the sample into the machine learning system for training purposes. Only scanned overall images of the sample are input into the machine learning system, which, e.g. by means of an autoencoder, is trained to determine a scan pattern that is as efficient as possible. What is advantageous about this is that little to no external knowledge or expert knowledge is required for training the machine learning system.

In accordance with one embodiment of the second method, the method furthermore comprises the following steps for training the machine learning system for improved reconstruction of the reconstructed overall image from the data of the scanned partial regions of the sample by means of supervised learning: inputting data of scanned partial regions, in particular simulated scanned partial regions, of the sample as training data into the machine learning system; and comparing the overall image of the sample that is reconstructed from the training data by means of the machine learning system with a non-reconstructed overall image of the sample for training the machine learning system for improved reconstruction of the overall image from the data of the scanned partial regions of the sample. This supervised learning enables the machine learning system to be trained rapidly and in a technically simple manner for improved reconstruction, i.e. as exact or precise construction of the overall image as possible.

In accordance with one embodiment of the second method, firstly subregions of the overall image are reconstructed substantially independently of one another from the data of the scanned partial regions of the sample, and then the partial regions are combined to form a reconstructed overall image. As a result, the reconstruction of the overall image in a computer can be distributed in a parallelized manner, i.e. among a plurality of processes. Consequently, the overall image can be reconstructed more rapidly and/or more by means of more complex calculations in the same time.

In accordance with one embodiment of the first and/or second method, the machine learning system has been or is trained in an optimization process simultaneously for improved determination of the partial regions of the sample which are scanned by the scanning microscope and for improved reconstruction of the reconstructed overall image from the scanned partial regions of the sample. What is advantageous about this is that as a result of the simultaneous optimization of the scan pattern, i.e. which partial regions of the sample are scanned or which partial regions are scanned in which order, and the reconstruction of the overall image of the sample, a particularly optimal scan pattern is determined since the manner of the reconstruction of the overall image and the scan pattern mutually influence one another. What is additionally advantageous about this is that the determination of the scan pattern is influenced by the performance of the method for reconstructing the overall image. By way of example, in the case of a high performance of the reconstruction of the overall image, i.e. a precise or exact overall image of the sample can be reconstructed just from few data of scanned partial regions, a scan pattern can be determined which scans partial regions with a particularly small area and/or with a particularly short duration for carrying out the scan. Consequently, the machine learning system trained thereby can particularly efficiently create an overall image of the sample from data of partial regions of the sample.

In accordance with one embodiment of the system, the machine learning system has been or is trained in an optimization process simultaneously for improved determination of the partial regions of the sample which are scanned by the scanning microscope and for improved reconstruction of the overall image of the sample from the scanned partial regions of the sample. What is advantageous about this is that as a result of the simultaneous optimization of the scan pattern, i.e. which partial regions of the sample are scanned or which partial regions are scanned in which order, and the reconstruction of the overall image of the sample, a particularly optimal scan pattern is determined since the manner of the reconstruction of the overall image and the scan pattern mutually influence one another. What is additionally advantageous about this is that the determination of the scan pattern is influenced by the performance of the step for reconstructing the overall image. By way of example, in the case of a high performance of the reconstruction of the overall image, i.e. a precise or exact overall image of the sample can be reconstructed just from few data of scanned partial regions, a scan pattern can be determined which scans partial regions with a particularly small area and/or with a particularly short duration for carrying out the scan. Consequently, the system or the trained machine learning system can particularly efficiently create an overall image of the sample from data of partial regions of the sample.

In accordance with one embodiment of the system, the system is configured firstly to reconstruct subregions of the overall image substantially independently of one another from the data of the scanned partial regions of the sample, and then to combine the partial regions to form a reconstructed overall image. As a result, in the system, the reconstruction of the overall image in a computer can be or have been parallelized, i.e. can be or have been distributed among a plurality of processors. Consequently, the overall image can be reconstructed more rapidly and/or by means of more complex calculations in the same time.

An efficient/optimal scan pattern and efficient/optimal determination of the partial regions which are scanned by the scanning microscope should be understood to mean, in particular, a scan pattern and respectively a determination of partial regions to be scanned which respectively reconstruct as accurate an overall image as possible of the sample from the scanned partial regions with the least possible radiation exposure, with the smallest possible area of the sample that is scanned, and/or with the scanning being carried out as rapidly as possible. An accurate an overall image as possible of the sample contains substantial no reconstruction artefacts, has a particularly high resolution and/or corresponds as far as possible to an image of the sample that is obtained by a complete scan of the sample. In this case, in particular, supervised learning can be used for training the machine learning system. This means that an overview image of the sample and/or information about the type or state of the sample (manually or in an automated manner) are/is input into the machine learning system together with a predefined (in particular non-reconstructed) overall image being input into the machine learning system. The machine learning system is then trained to reconstruct from the input data an overall image which corresponds to the predefined overall image as exactly as possible, wherein simultaneously, i.e. in an optimization process, the scan pattern is determined as optimally as possible and reconstruction of the overall image of the sample from the scanned partial regions of the sample is optimized.

How exactly or accurately the reconstructed overall image corresponds to a or the actual overall image can be determined in various ways. By way of example, the index of structural similarity (SSIM) between the reconstructed overall image and a non-reconstructed overall image (which was determined e.g. from a complete scan of the sample) can be calculated or determined and be used as a figure of merit or value for the exactness or the similarity or the correspondence between the reconstructed overall image and the actual overall image of the sample. A further possibility for this is the peak signal-to-noise ratio (PSNR).

During the training of the machine learning system, it is possible to optimize in particular a specific property (e.g. scan time, reconstruction quality of the overall image, radiation exposure of the sample during scanning) taking account of another property (e.g. radiation exposure of the sample during scanning, reconstruction quality of the overall image, scan time). By way of example, the machine learning system is optimized for the highest possible reconstruction quality of the overall image, i.e. as exact correspondence as possible to an image of a sample that was obtained by complete scanning of the sample, with a predefined maximum scan time and/or a predefined maximum radiation exposure.

During the joint optimization of the determination of the scan pattern or the partial regions to be scanned of the sample and the reconstruction of the overall image of the sample or during the simultaneous optimization of the determination of the scan pattern and the reconstruction of the overall image, in particular all parameters for determining the scan pattern and reconstructing the overall image of the sample can be trained simultaneously or at the same time in the context of an end-to-end learning principle.

The influencing of the reconstruction of the overall image by the scan pattern or the determination of the scan pattern and the influencing of the scan pattern determination by the reconstruction of the overall image can be achieved in the case of deep learning/neural networks, for example, by: Backpropagation or Error Feedback In this case, the scan pattern can be interpreted as an intermediate representation (intermediate layer) and a single neural network can be present or be designed (which encompasses both the scan pattern determination and the reconstruction of the overall image in a single neural network), the parameters of which are optimized simultaneously and in a common loss function by means of backpropagation. What is advantageous here is that the error fed back into the network as a result of the reconstruction of the overall image of the sample also reaches that part of the neural network which is responsible for the scan pattern determination, and improves the reconstruction of the overall image of the sample or reduces reconstruction errors. The joint optimization can be trained by means of supervised learning, unsupervised learning and/or reinforcement learning.

Weight Sharing

This can involve a neural network for determining the scan pattern or the partial regions to be scanned of the sample and a neural network for the reconstruction of the overall image of the sample. These two neural networks can share specific parameters (weights) or a portion of the parameters (weight) and thus also mutually support each other/exchange experiences.

A further possibility for simultaneously optimizing or training the machine learning system with regard to the scan patterns or partial regions to be scanned of the sample and with regard to the reconstruction of the overall image of the sample is to make the joint optimization iterative. In this case, step by step, one part (determination of the scan pattern or reconstruction of the overall image of the sample) is always assumed to be given, and the other part is optimized on the basis of the given part. This is followed by the changeover in which the previously optimized part is assumed to be given and the first part is optimized. This process can be repeated a number of times; in particular, this process can be repeated often enough until a specific predefined criterion is attained (e.g. a predefined number of repetitions or iterations, a maximum scan time, a maximum area to be scanned of the sample, a maximum radiation exposure of the sample and/or a minimum reconstruction quality of the overall image of the sample and/or spatial and/or temporal resolution of the reconstructed overall image of the sample and/or stagnation is reached, i.e. in the case of a plurality of successive repetitions or iterations, the changes lie below a predefined minimum value). This procedure describes a semi-simultaneous optimization of the parameters of both parts (determination of the scan pattern and reconstruction of the overall image of the sample), which should also be understood as a kind of simultaneous optimization or optimization at the same time, and which is similar to an expectation maximization algorithm or an estimation maximization algorithm.

Estimating the non-scanned partial regions of the sample can be carried out in particular by calculating estimates or values or the like.

A further invention present is based on the object of disclosing a method and respectively a device and respectively a system which make it possible to determine partial regions of the sample that are to be captured in an automated manner for a microscope. In addition, the overall image of the sample can be reconstructed from the captured partial regions of the sample.

This object is achieved by means of a method as described below, a computer program product as described below, a computer-readable medium as described below, and a system as described below.

In particular, this object is achieved by means of a method for capturing partial regions of a sample by means of a microscope, in particular by means of a wide-field microscope, wherein the method comprises the following steps:—determining the partial regions of the sample which are scanned by the microscope, in particular the partial regions of the sample and the order in which the partial regions of the sample are scanned, by means of a machine learning system, wherein the machine learning system is trained by means of supervised learning, unsupervised learning, in particular on the basis of an autoencoder, and/or reinforcement learning for improved determination of the partial regions of the sample which are scanned by the microscope; and—capturing the determined partial regions of the sample by means of the microscope.

One advantage of this is that the partial regions of the sample which are captured by the microscope are determined in an automated manner by means of a trained machine learning system. By means of the trained machine learning system, particularly efficient capture patterns, i.e. which partial regions of the sample are captured, are determined rapidly and in a technically simple manner. The particularly efficient capture patterns may be determined for example by a short time required for capture, by a particularly low radiation exposure of the sample during the capture of the partial regions, or similar properties. In the case of this method, once training has taken place, human or manual intervention by a user or human being is not required.

In particular, this object is also achieved by means of a method for capturing partial regions of a sample by means of a microscope, in particular by means of a wide-field microscope, and for reconstructing an overall image of the sample from data of the captured partial regions of the sample, in particular a method in accordance with the method described two paragraphs previously, wherein the method comprises the following steps:—determining the partial regions of the sample which are scanned by the microscope, in particular the partial regions of the sample and the order in which the partial regions of the sample are captured; —capturing the partial regions of the sample by means of the microscope; —inputting the data of the captured partial regions into a machine learning system; and—reconstructing the overall image of the sample from the data of the captured partial regions of the sample by means of the machine learning system, wherein non-captured partial regions of the sample are estimated of means of the data of the captured partial regions of the sample by the machine learning system, wherein the machine learning system is trained by means of supervised learning, unsupervised learning, in particular on the basis of an autoencoder, and/or a reinforcement learning for improved reconstruction of the reconstructed overall image of the sample from the data of the captured partial regions of the sample.

One advantage of this is that the overall image of the sample is reconstructed in an automated manner by means of a trained machine learning system. By means of the trained machine learning system, the reconstructed overall image is determined rapidly and in a technically simple manner. In addition, the reconstructed overall image is determined particularly precisely by the machine learning system, i.e. corresponds as well as possible to an overall capture or complete scan of the sample. In the case of this method, once training has taken place, human or manual intervention by a user or human being is not required.

In particular, the object is also achieved by means of a computer program product having instructions which are readable by a processor of a computer and which, when they are executed by the processor, cause the processor to carry out one of the methods mentioned above.

In particular, the object is also achieved by means of a computer-readable medium, on which the computer program product is stored.

In particular, the object is also achieved by means of a system for capturing partial regions of a sample by means of a microscope, in particular by means of a wide-field microscope, wherein the system comprises a machine learning system which, by means of supervised learning, unsupervised learning, in particular on the the basis of an autoencoder, and/or reinforcement learning, is trained to carry out the following:—determining the partial regions of the sample which are captured by the microscope, in particular the partial regions of the sample and the order in which the partial regions of the sample are captured, by means of the machine learning system.

One advantage of this is that the partial regions of the sample which are captured by the microscope are determined in an automated manner by means of a trained machine learning system. By means of the trained machine learning system, particulary efficient capture patterns, i.e. which partial regions of the sample are captured, are determined rapidly and in a technically simple manner. The particularly efficient capture patterns may be distinguished for example by a short time required for capturing, by a particularly low radiation exposure of the sample during the capturing of the partial regions, or similar properties. In the case of this system, once training has taken place, human or manual intervention by a user or human being is not required.

In particular, the object is also achieved by means of a system for capturing partial regions of a sample by means of a microscope, in particular by means of a wide-field microscope, and for reconstructing an overall image of the sample from data of the captured partial regions of the sample, in particular a system as described two paragraphs previously, wherein the system comprises a machine learning system which, by means of supervised learning, unsupervised learning, in particular on the the basis of an autoencoder, and/or reinforcement learning, is trained to carry out the following:—reconstructing the overall image of the sample from the data of the captured partial regions of the sample by means of the machine learning system, wherein non-captured partial regions of the sample are estimated by means of the data of the captured partial regions of the sample by the machine learning system.

One advantage of this is that the system reconstructs the overall image of the sample in an automated manner by means of a trained machine learning system. By means of the trained machine learning system, the reconstructed overall image is determined rapidly and in a technically simple manner. In addition, the reconstructed overall image is determined particularly precisely by the machine learning system, i.e. corresponds as well as possible to an overall capture or complete capture of the sample. In the case of this system, once training has taken place, human or manual intervention by a user or human being is not required. A further advantage is that overall images having a particularly high quality or exactness are reconstructed.

In accordance with one embodiment of the first method for capturing partial regions, the method furthermore comprises the following step: reconstructing the overall image of the sample from the data of the captured partial regions of the sample wherein non-captured partial regions of the sample are estimated by means of the data of the captured partial regions of the sample. What is advantageous about this is that a particularly precise or accurate reconstruction of the overall image of the sample is achieved.

In accordance with one embodiment of the first method for capturing partial regions, the method furthermore comprises the following steps for training the machine learning system by means of reinforcement learning: inputting one or more figures of merit, for example the total time expenditure for capturing the partial regions and/or the total radiation exposure of the sample during the capturing of the partial regions of the sample and/or the quality of the reconstructed overall image of the sample, into the machine learning system; and varying the partial regions of the sample which are captured and/or the order in which the partial regions of the sample are captured in order to achieve a figure of merit that is as optimal as possible or figures of merit that are as optimal as possible. What is advantageous about this is that the machine learning system is trained rapidly and in a technically simple manner by means of reinforcement learning in order to determine a capture pattern that is as optimal as possible. An optimal capture pattern can be, in particular, a capture pattern which enables the overall image of the sample to be reconstructed as exactly or precisely as possible with a short time duration for capturing with the least possible radiation exposure of the sample while capturing. In particular, in the case of reinforcement learning, in each step it is possible to allocate a reward or punishment with regard to the figure of merit to be minimized or to be maximized (time duration of the capture, radiation exposure, quality or exactness of the reconstruction of the overall image), in particular in an automated manner. Varying the partial regions can be carried out by means of a microscope or can be carried out by simulation of the capturing of partial regions on the basis of an overall image.

In accordance with one embodiment of the first method for capturing partial regions, before the partial regions of the sample are captured, an overview image of the sample is input into the machine learning system for improved determination of the partial regions which are captured by the microscope. As a result, the machine learning system can identify partial regions of the sample which have a particularly high information density (e.g. edges of elements, partial regions in which elements are present, etc.) already before the partial regions are determined. An even more efficient capture pattern can thus be determined by the machine learning system.

In accordance with one embodiment of the first method, the method furthermore comprises the following step: reconstructing the overall image of the sample from the data of the captured partial regions of the sample and the overview image. In other words, the overall image can be reconstructed on the basis of a combination of the data of the captured partial regions and the overview image. What is advantageous about this is that a particularly precise overall image can be reconstructed. By way of example, if the overview image has a low resolution and the captured partial regions have a higher resolution, by means of the captured partial regions and the overview image an overall image can be reconstructed which represents a more precise image of the sample than on the basis of the captured partial regions alone.

In accordance with one embodiment of the first method, the overview image comprises a reconstructed overall image of the sample; in particular, the overview image is a reconstructed overall image of the sample. What is advantageous about this is that the method can be employed iteratively. This means that after a first pass through the processes of determining the partial regions, capturing the partial regions and reconstructing the overall image, the reconstructed overall image is input as overview image into the machine learning system and once again partial regions to be captured are determined, the determined partial regions are captured by the microscope and then an overall image is reconstructed. The number of iterations can be two, three or more. A particularly precise or accurate overall image of the sample can be reconstructed in this way. In the renewed step of reconstructing the overall image, besides the captured partial regions, the overall image reconstructed previously (generated during a previous iteration) can also influence the reconstruction of the overall image.

In accordance with one embodiment of the first method for capturing partial regions, the method furthermore comprises the following steps for training the machine learning system by means of unsupervised learning: inputting non-reconstructed overall images of samples into the machine learning system; and determining the partial regions of the sample which have a particularly high information density on the basis of the respective non-reconstructed overall image by means of an autoencoder for improved determination of the partial regions of the sample which are captured by the microscope. What is advantageous about this is that there is no need to input captured partial regions of the sample into the machine learning system for training purposes. Only captured overall images of the sample are input into the machine learning system, which, e.g. by means of an autoencoder, is trained to determine a capture pattern that is as efficient as possible. What is advantageous about this is that little to no external knowledge or expert knowledge is required for training the machine learning system.

In accordance with one embodiment of the second method for capturing partial regions, the method furthermore comprises the following steps for training the machine learning system for improved reconstruction of the reconstructed overall image from the data of the captured partial regions of the sample by means of supervised learning: inputting data of captured partial regions, in particular simulated captured partial regions, of the sample as training data into the machine learning system; and comparing the overall image of the sample that is reconstructed from the training data by means of the machine learning system with a non-reconstructed overall image of the sample for training the machine learning system for improved reconstruction of the overall image from the data of the captured partial regions of the sample. This supervised learning enables the machine learning system to be trained rapidly and in a technically simple manner for improved reconstruction, i.e. as exact or precise construction of the overall image as possible.

In accordance with one embodiment of the second method for capturing partial regions, the machine learning system has been or is trained in an optimization process simultaneously for improved determination of the partial regions of the sample which are captured by the microscope and for improved reconstruction of the reconstructed overall image from the captured partial regions of the sample. What is advantageous about this is that as a result of the simultaneous optimization of the capture pattern, i.e. which partial regions of the sample are captured or which partial regions are captured in which order, and the reconstruction of the overall image of the sample, a particularly optimal capture pattern is determined since the manner of the reconstruction of the overall image and the capture pattern mutually influence one another. What is additionally advantageous about this is that the determination of the capture pattern is influenced by the performance of the step for reconstructing the overall image. By way of example, in the case of a high performance of the reconstruction of the overall image, i.e. a precise or exact overall image of the sample can be reconstructed just from few data of captured partial regions, a capture pattern can be determined which captures partial regions with a particularly small area and/or with a particularly short duration for carrying out the capture. Consequently, the system or the trained machine learning system can particularly efficiently create an overall image of the sample from data of partial regions of the sample.

In accordance with one embodiment of the first system for capturing partial regions, the system is configured for reconstructing an overall image of the sample from data of the captured partial regions of the sample, wherein the system is configured for estimating non-captured partial regions of the sample by means of the data of the captured partial regions of the sample. One advantage of this is that overall images having a particularly high quality or exactness are reconstructed.

In accordance with one embodiment of the second system for capturing partial regions, the machine learning system has been or is trained in an optimization process simultaneously for improved determination of the partial regions of the sample which are captured by the microscope and for improved reconstruction of the overall image of the sample from the captured partial regions of the sample. What is advantageous about this is that as a result of the simultaneous optimization of the capture pattern, i.e. which partial regions of the sample are captured in which order, and the reconstruction of the overall image of the sample, a particularly optimal capture pattern is determined since the manner of the reconstruction of the overall image and the capture pattern mutually influence one another. What is additionally advantageous about this is that the determination of the capture pattern is influenced by the performance of the step for reconstructing the overall image. By way of example, in the case of a high performance of the reconstruction of the overall image, i.e. a precise or exact overall image of the sample can be reconstructed just from few data of captured partial regions, a capture pattern can be determined which captures partial regions with a particularly small area and/or with a particularly short duration for carrying out the capture. Consequently, the system or the trained machine learning system can particularly efficiently create an overall image of the sample from data of partial regions of the sample.

An efficient/optimal capture pattern and efficient/optimal determination of the partial regions which are captured by the microscope, in particular by the wide-field microscope, should be understood to mean, in particular, a capture pattern and respectively a determination of partial regions to be captured which respectively reconstruct as accurate an overall image as possible of the sample from the captured partial regions with the least possible radiation exposure, with the smallest possible area of the sample that is captured, and/or with the capturing being carried out as rapidly as possible. As accurate an overall image as possible of the sample contains substantial no reconstruction artefacts, has a particularly high resolution and/or corresponds as far as possible to an image of the sample that is obtained by a complete capture of the sample. In this case, in particular, supervised learning can be used for training the machine learning system. This means that an overview image of the sample and/or information about the type or state of the sample (manually or in an automated manner) are/is input into the machine learning system together with a predefined (in particular non-reconstructed) overall image being input into the machine learning system. The machine learning system is then trained to reconstruct from the input data an overall image which corresponds to the predefined overall image as exactly as possible, wherein simultaneously, i.e. in an optimization process, the capture pattern is determined as optimally as possible and reconstruction of the overall image of the sample from the captured partial regions of the sample is optimized.

How exactly or accurately the reconstructed overall image corresponds to a or the actual overall image can be determined in various ways. By way of example, the index of structural similarity (SSIM) between the reconstructed overall image and a non-reconstructed overall image (which was determined e.g. from a complete capture of the sample) can be calculated or determined and be used as a figure of merit or value for the exactness or the similarity or the correspondence between the reconstructed overall image and the actual overall image of the sample. A further possibility for this is the peak signal-to-noise ratio (PSNR).

During the training of the machine learning system, it is possible to optimize in particular a specific property (e.g. capture time, reconstruction quality of the overall image, radiation exposure of the sample during capturing) taking account of another property (e.g. radiation exposure of the sample during capturing, reconstruction quality of the overall image, capture time). By way of example, the machine learning system is optimized for the highest possible reconstruction quality of the overall image, i.e. as exact correspondence as possible to an image of a sample that was obtained by complete capturing of the sample, with a predefined maximum capture time and/or a predefined maximum radiation exposure.

During the joint optimization of the determination of the capture pattern or the partial regions to be captured of the sample and the reconstruction of the overall image of the sample or during the simultaneous optimization of the determination of the capture pattern and the reconstruction of the overall image, in particular all parameters for determining the capture pattern and reconstructing the overall image of the sample can be trained simultaneously or at the same time in the context of an end-to-end learning principle.

The influencing of the reconstruction of the overall image by the capture pattern or the determination of the capture pattern and the influencing of the capture pattern determination by the reconstruction of the overall image can be achieved in the case of deep learning/neural networks, for example, by:

Backpropagation or Error Feedback

In this case, the capture pattern can be interpreted as an intermediate representation (intermediate layer) and a single neural network can be present or be designed (which encompasses both the capture pattern determination and the reconstruction of the overall image in a single neural network), the parameters of which are optimized simultaneously and in a common loss function by means of backpropagation. What is advantageous here is that the error fed back into the network as a result of the reconstruction of the overall image of the sample also reaches that part of the neural network which is responsible for the capture pattern determination, and improves the reconstruction of the overall image of the sample or reduces reconstruction errors. The joint optimization can be trained by means of supervised learning, unsupervised learning and/or reinforcement learning.

Weight Sharing

This can involve a neural network for determining the capture pattern or the partial regions to be captured of the sample and a neural network for the reconstruction of the overall image of the sample. These two neural networks can share specific parameters (weights) or a portion of the parameters (weight) and thus also mutually support each other/exchange experiences.

A further possibility for simultaneously optimizing or training the machine learning system with regard to the capture patterns or partial regions to be captured of the sample and with regard to the reconstruction of the overall image of the sample is to make the joint optimization iterative. In this case, step by step, one part (determination of the capture pattern or reconstruction of the overall image of the sample) is always assumed to be given, and the other part is optimized on the basis of the given part. This is followed by the changeover in which the previously optimized part is assumed to be given and the first part is optimized. This process can be repeated a number of times; in particular, this process can be repeated often enough until a specific predefined criterion is attained (e.g. a predefined number of repetitions or iterations, a maximum capture time, a maximum area to be captured of the sample, a maximum radiation exposure of the sample and/or a minimum reconstruction quality of the overall image of the sample and/or spatial and/or temporal resolution of the reconstructed overall image of the sample and/or stagnation is reached. i.e. in the case of a plurality of successive repetitions or iterations, the changes lie below a predefined minimum value). This procedure describes a semi-simultaneous optimization of the parameters of both parts (determination of the capture pattern and reconstruction of the overall image of the sample), which should also be understood as a kind of simultaneous optimization or optimization at the same time, and which is similar to an expectation maximization algorithm or an estimation maximization algorithm.

Estimating the non-captured partial regions of the sample can be carried out in particular by calculating estimates or values or the like.

Figure 11:
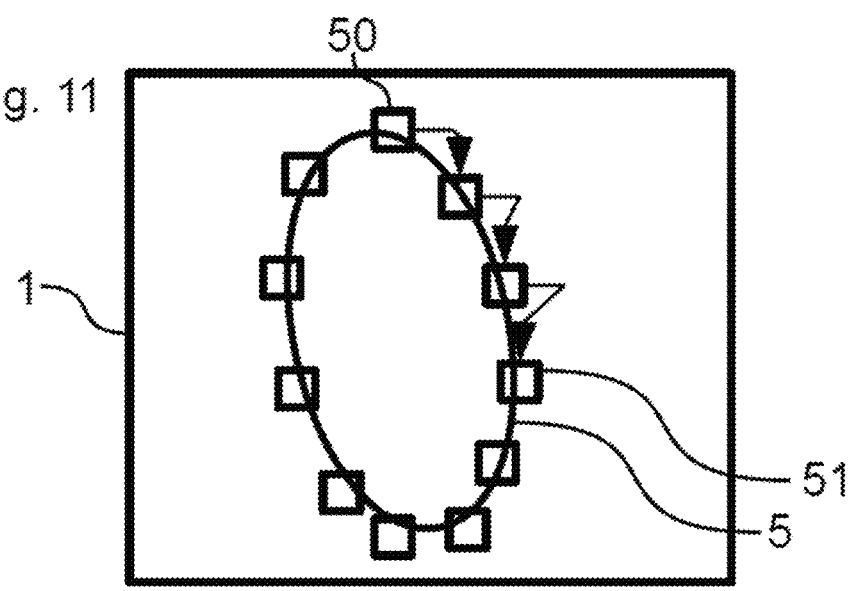
FIG. 11 shows a seventh capture pattern of the sample from FIG. 1 in accordance with one embodiment of the method.

Preferred embodiments are evident as described. The invention is explained in greater detail below with reference to drawings of exemplary embodiments. In the figures:

FIG. 1 shows a sample comprising four elements, wherein the sample is situated on a carrier;

FIG. 2 shows a schematic illustration of one embodiment of the system according to the invention;

FIG. 3 shows a first scan pattern of the sample from FIG. 1 in accordance with one embodiment of the method according to the invention;

FIG. 4 shows a second scan pattern of the sample from FIG. 1 in accordance with one embodiment of the method according to the invention;

FIG. 5 shows a third scan pattern of the sample from FIG. 1 in accordance with one embodiment of the method according to the invention:

FIG. 6 shows a fourth scan pattern of the sample from FIG. 1 in accordance with one embodiment of the method according to the invention:

FIG. 7 shows complete scanning point by point of a sample comprising four elements, wherein the sample is situated on a carrier, in accordance with the related art;

FIG. 8 shows a schematic illustration of a further embodiment of the system according to the invention;

FIG. 9 shows a fifth capture pattern of the sample from FIG. 1 in accordance with one embodiment of the method according to the invention:

FIG. 10 shows a sixth capture pattern of the sample from FIG. 1 in accordance with one embodiment of the method according to the invention; and FIG. 11 shows a seventh capture pattern of the sample from FIG. 1 in accordance with one embodiment of the method according to the invention.

The same reference numerals are used in the following description for identical parts and parts having an identical effect.

FIG. 1 shows a sample 1 comprising four elements 5-8, wherein the sample 1 is situated on a carrier. The sample 1 can comprise living elements, e.g. cells, wherein the four elements 5-8 each constitute a cell. It is also conceivable for the sample 1 to be inanimate, i.e. the sample 1 in FIG. 1 has e.g. four iron fragments.

The sample 1 or partial regions 10-15 of the sample 1 is/are scanned by means of a scanning microscope, e.g. a laser scanning microscope (LSM) or a scanning electron microscope (SEM).

The sample 1 is not usually scanned completely, however, rather only partial regions 10-15 of the sample 1 are scanned by means of the scanning microscope. The partial regions 10-15 of the sample 1 can be punctiform or areal. The partial regions 10-15 of the sample 1 can be contiguous or they can be spaced apart from one another.

It is also conceivable for the sample 1 to be scanned in three spatial dimensions. In this case, it is possible for the sample 1 not to be completely scanned in one or more spatial dimensions, but rather to be scanned only partially or in partial regions of the sample 1. It is also conceivable for a sample 1 to be scanned in two spatial dimensions overtime, i.e. repeatedly at different points in time or temporally continuously. Partial regions here can be partial regions in one or two spatial dimensions and/or the sample 1 is scanned only in partial regions in the time dimension, i.e. at specific points in time or at specific time periods. Thus, for example, continuous scanning of the sample 1 does not take place, and so the sample 1 is scanned only in partial regions from a temporal standpoint. Said points in time or time periods are determined by the trained machine learning system.

The same applies to a four-dimensional scanning of the sample 1, in three spatial dimensions and in the time dimension. In this case, too, the sample can be scanned only in partial regions in one or more of the dimensions. By way of example, the sample 1 is not scanned continuously or quasi-continuously in the temporal dimension, but rather only at points in time or time periods determined by the machine learning system.

The data 25 of the partial regions 10-15 of the sample 1 which are scanned by the scanning microscope are subsequently used to reconstruct an overall image 40 of the sample 1 therefrom. During the reconstruction of the overall image 40 of the sample 1, the non-scanned partial regions 10-15 of the sample 1 are estimated or calculated from the scanned partial regions 10-15. Consequently, the non-scanned partial regions 10-15 of the sample 1 are deduced from the scanned partial regions 10-15 of the sample 1 (so-called compressed sensing).

By means of this compressed sensing, an overall image 40 of the sample 1 can be created in a particularly short time since the entire sample 1 or the entire carrier is not scanned, but rather only a part or partial regions thereof.

FIG. 2 shows a schematic illustration of one embodiment of the system 20 according to the invention. The system 20 comprises a trained machine learning system 30, which is used to determine the partial regions 10-15 of the sample 1 which are scanned, and reconstructs an overall image 40 of the sample 1 from the data 25 of the scanned partial regions 10-15.

The partial regions 10-15 of the sample 1 which are scanned i.e. the scan pattern, are determined by a machine learning system 30. The order of the partial regions 10-15 which are scanned is also determined by the machine learning system 30.

The machine learning system 30 can be or have been trained by reinforcement learning, supervised learning and/or unsupervised learning to determine as optimally as possible the partial regions 10-15 of the sample 1 which are scanned. The optimal determination of the partial regions 10-15 to be scanned can be carried out with the aim of the shortest possible time required for scanning the partial regions 10-15, the least possible radiation exposure of the sample 1, the best possible reconstruction, etc. In other words, the properties mentioned are in each case the variable to be optimized.

In the case of reinforcement learning for improved determination or as optimal determination as possible of the partial regions 10-15 of the sample 1 which are to be scanned, one or more figures of merit are input into the machine learning system 30 by a human expert. What is additionally input into the machine learning system 30 is that in each step of carrying out the determination of the partial regions 10-15 to be scanned, by means of the machine learning system, a reward and/or a punishment are/is allocated, and the magnitude of the reward and/or punishment. By way of example, the scan of a larger partial region 10-15 needs a longer time than the scan of a smaller partial region 10-15 of the sample 1, and so in the case of the latter a time penalty, i.e. a punishment, is added, the magnitude of the punishment of the step being dependent on the area of the partial region 10-15. As a further example, a punishment may be added in the case of irradiating a larger area, since this increases the radiation exposure of the sample 1. A punishment may also be added in the case of longer irradiation. The reconstruction quality of the reconstructed overall image 40. i.e. how well said reconstructed overall image 40 corresponds to a non-reconstructed overall image 40 that was created e.g. by complete scanning or a complete scan of the sample 1, may also be a figure of merit.

Through simulated or actual scanning by means of a scanning microscope, the machine learning system 30 attempts to determine, on the basis of training data of samples 1, an optimum scan pattern in each case, i.e. a scan pattern for which the figure of merit is as low as possible (e.g. the shortest possible time) or as high as possible (e.g. the highest possible reconstruction quality). In this case, a predefined value of a second variable, e.g. the required time or the maximum total area which the partial regions 10-15 to be scanned are permitted to have overall, acts as a limiting factor since otherwise e.g. the entire sample 1 is scanned since the reconstruction quality is then the highest or best.

It is also possible for samples 1 that have already been coarsely scanned to be input as training data into the machine learning system 30 and for the machine learning system 30 to be intended to determine a scan pattern that is as efficient as possible.

A further possibility for training the machine learning system 30 for improved determination of the partial regions 10-15 of the sample 1 which are to be scanned, and the order in which they are to be scanned, is supervised learning. In this case, a human being or experienced user predefines a training set $\{(x_1, y_1), (x_2, y_2), (x_3, y_3), \ldots\}$, wherein $x_n$ includes information about the sample 1 and the associated $y_n$ represents the scan pattern respectively assigned by the human expert or the partial regions 10-15 to be scanned and the order thereof.

The scan pattern predefined by the expert can originate from a fixedly predefined selection of scan patterns (classification problem) or can be specified e.g. as a binary image.

By way of example, x can comprise an overview image of the sample 1 (e.g. created by an overview camera or a fast, coarse scan of the sample 1), indications regarding the type and/or state of the sample 1 (living, inanimate, etc.), wherein said indications can be input manually into the machine learning system 30 or were determined in an automated manner, type and state of the scanning microscope (e.g. the hardware equipment) and/or information about the purpose of use of the reconstructed overall image 40 of the sample 1, i.e. which image properties of the overall image 40 are relevant.

The machine learning system 30 learns from the training data or the training set a mapping of $x_n$ to $y_n$ in order then to determine for unknown x a scan pattern or the partial regions 10-15 to be scanned of a (more or less unknown) sample 1 in such a way that the machine learning system 30 maps x to the actual y as well as possible.

According to this supervised learning, the machine learning system 30 is trained to determine, in the case of an unknown sample 1, the best or most efficient scan pattern possible, i.e. which partial regions 10-15 of the sample 1 are scanned in which order.

A third possibility for training the machine learning system 30 is unsupervised learning. In this case, only overall images 40 of the sample 1, in particular non-reconstructed overall images 40 of the sample 1, are input as training data into the machine learning system 30. The machine learning system 30 is trained on the overall images 40 by means of an autoencoder, for example. From the so-called bottleneck of the autoencoder, in particular the sparsest layer of a deep autoencoder, the machine learning system 30 can deduce which partial regions 10-15 of the overall image 40 of the sample 1 and thus which partial regions 10-15 of the sample 1 itself are particularly important or have a particular high information density (e.g. includes an edge of an element 5-8 of the sample 1). The machine learning system 30 derives from this which scan pattern is particularly optimal or efficient. In particular, the machine learning system 30 learns to determine the partial regions 10-15 of the sample 1 which have a high information density. In the case of unknown samples, the machine learning system 30 thus determines the partial regions 10-15 of the sample 1 which are particularly useful in the reconstruction of the overall image 40 of the sample 1 since these partial regions 10-15 have a particularly high information density (e.g. an edge of an element 5-8 of the sample 1). The training goal here is thus to determine partial regions 10-15 with the highest possible information density.

The machine learning system 30 is trained by means of training data in one of these ways. The machine learning system 30, if a sample 1 is to be scanned, then determines which partial regions 10-15 of the sample 1 are scanned in which order by the scanning microscope. In this case, information about the sample 1, e.g. how many elements 5-8 the sample 1 comprises, the size of the elements 5-8 of the sample 1, whether the elements 5-8 of the sample 1 move, etc., and/or about the scanning microscope, e.g. what radiation exposure the scanning microscope causes, how long it takes to scan a partial region 10-15 of a predefined area etc., and/or about the purpose for which the created overall image 40 is required, e.g. whether the overall image 40 is required for identifying details of the elements 5-8 of the sample 1, whether the overall image 40 is required for tracking movements of elements 5-8 of the sample 1, whether the overall image 40 is required for determining the number of elements 5-8 of the sample 1, etc., can be input into the machine learning system 30.

Determining the partial regions can encompass partial regions in one of the three spatial dimensions and/or partial regions in the time dimension (i.e. points in time and/or time periods). These partial regions are determined in each case by a machine learning system.

So-called deep learning can be employed or used in each of the three specified types of training of the machine learning system 30. In particular, so-called deep Q-learning can be used in reinforcement learning of the machine training system. In particular, one or more so-called Convolutional Neural Networks (CNNs) can be used in supervised learning. In particular, a so-called deep autoencoder can be used in unsupervised learning.

The quality of the scan pattern or of the partial regions 10-15 to be scanned by the sample 1 which are determined by the machine learning system 30 can e.g. also encompass the reconstruction quality, i.e. the quality of the reconstructed overall image 40. By way of example, a human being views or analyzes the reconstructed overall image 40 of the sample 1 to ascertain whether it has a desired resolution of the elements 5-8 of the sample 1 and/or whether it is free of reconstruction artefacts. Alternatively or additionally, if the reconstructed overall image 40 is used for tracking the location of elements 5-8 of the sample 1 over time, it is possible to check whether the overall image 40 has a quality or resolution high enough that the tracking of the location of the elements 5-8 is readily possible.

The overall image 40 can also be scanned and/or reconstructed depending on whether or how it is subsequently processed further or post-processed manually or in an automated manner. If the post-processing imposes specific conditions on the overall image 40, e.g. requires a specific resolution (from a temporal and/or spatial standpoint), the machine learning system can correspondingly determine the partial regions to be scanned and/or can correspondingly reconstruct the overall image.

The following information, inter alia, can be input into the machine learning system 30 for training the machine learning system and/or for determining the partial regions to be scanned and/or for reconstructing the overall image of the sample from the scanned partial regions, either manually by a human being or in an automated manner by further devices:

design, equipment specification, technical possibilities of the scanning microscope used, for example the recording speed of a scan pattern depending on the hardware components of the scanning microscope (in the case of laser scanning microscopes, sinusoidal movements can usually be carried out particularly rapidly).

information about the sample 1, e.g. whether the elements 5-8 of the sample 1 are arranged regularly or irregularly, whether the sample 1 has a specific biological cell type (it is then possible to choose a scan pattern with the typical density of the sample 1, which scan pattern corresponds to the position and size of the corresponding cells), and/or information about location-dependent/local patterns of the sample 1 (it is thereby possible to save time during the scanning of the sample 1 and to suppress the background of the sample 1 particularly well).

purpose of use of the sample 1, e.g. whether the overall image 40 of the sample 1 is used for navigation and/or orientation (a fast, not very detailed overall image 40 may then be preferred), whether elements 5-8 of the sample 1 are intended to be tracked and/or counted or observed over time (overall images 40 with minor details of the elements 5-8 may then be preferred), whether only specific regions of the sample 1 are of interest, etc.

The scan pattern or the partial regions 10-15 to be scanned of the sample 1 which are determined by the machine learning system 30 can be, inter alia, regular (e.g. sinusoidal shape, punctiform shape, strip shape, loop shape), stochastic (e.g. points, strips, trajectories) and/or adaptive (e.g. searching and refining, whether the partial regions 10-15 that are to be scanned further are determined on the basis of the data 25 of the already scanned partial regions 10-15 of the sample 1 and/or from the already reconstructed part of the overall image 40 of the sample 1).

From the data 25 that the scanning microscope receives from the scanned partial regions 10-15 of the sample 1, the overall image 40 of the sample 1 is reconstructed by means of a machine learning system 30. The overall image 40 of the sample 1 corresponds to the image which would be received or generated by the scanning microscope if the sample 1 were scanned completely or substantially to the extent of 100%.

The machine learning system 30 for reconstructing the overall image 40 of the sample 1 can be the same machine learning system 30 which was used for determining the partial regions 10-15 to be scanned of the sample 1.

The machine learning system 30 can be or have been trained for reconstructing the overall image 40 of the sample 1 by means of supervised learning, unsupervised learning and/or reinforcement learning.

During the reconstruction of the overall image 40 by means of the machine learning system 30, an overview image of the sample 1 and/or information about the structure or the pattern of the sample 1 can be input into the machine learning system 30.

During supervised learning for improved reconstruction of the overall image 40 of the sample 1 from scanned partial regions 10-15 of the sample 1, training data in the form of data 25 from the scanned partial regions 10-15 of the sample 1 are input into the machine learning system 30. The scanned partial regions 10-15 can be simulated data 25 generated on the basis of a non-reconstructed overall image 40, or real recording data of a scanning microscope. In addition, a complete image or an overall image 40 is input into the machine learning system 30. On the basis of the training data, the machine learning system 30 learns how as optimum an overall image 40 as possible of the sample 1 can be reconstructed from the data 25 of the partial regions 10-15 of the sample 1, since the non-reconstructed overall image 40 is likewise input as target or ideal into the machine learning system 30. As optimum an overall image 40 as possible of the sample 1 has no reconstruction artefacts, i.e. no reconstructive elements or partial elements of the sample 1 at locations at which an element of the sample 1 is not actually present, has the highest possible resolution and substantially corresponds to an overall image 40 of the sample 1 which is created by a complete scan of the sample.

The models for reconstructing the overall image 40 which are used by the machine learning system 30 can be generic (i.e. be or have been trained on mixed data 25 of partial regions 10-15) or be or have been trained on specific data 25, e.g. on concrete samples 1 and/or sample types and/or microscope types and/or purposes of use of the overall image 40 etc.

The methods used when training the machine learning system 30 for improved reconstruction can be, in particular, traditional methods, such as e.g. dictionary learning, principal component analysis (PCA) and/or deep learning methods such as e.g. image-to-image networks, in which the data 25 of the scanned partial regions 10-15 are mapped directly to the reconstructed overall image 40, or decoder networks for a one-dimensional signal which receives as input the data 25 of the scanned partial regions 10-15 along the scanning trajectory and maps the one-dimensional signal to the non-reconstructed overall image 40.

It is possible for the machine learning system 30 to reconstruct the overall image 40 directly, or for subregions of the overall image 40 to be reconstructed independently of one another and then for the overall image 40 to be constituted from the subregions. This allows a parallelization of the reconstruction of the overall image 40.

It is also possible for the optimization of the scan pattern, i.e. which partial regions 10-15 of the sample 1 are scanned in which order thereof, not to be carried out independently of the reconstruction of the overall image 40 from the scanned partial regions 10-15, rather for this to be carried out in one process, i.e. in a manner respectively dependent on one another. This means that a machine learning system 30 has been or is trained simultaneously in one procedure or process to determine as efficiently as possible the partial regions 10-15 which are scanned and to carry out the reconstruction of the overall image 40 from the scanned partial regions 10-15 as efficiently as possible. In this case, the determination of the scan pattern is influenced by the performance or quality of the reconstruction of the overall image 40.

The optimization of the determination of the scan pattern is thus dependent on the reconstruction of the overall image 40 from the scanned partial regions 10-15 of the sample 1 and the optimization of the reconstruction of the overall image 40 is dependent on the determination of the scan pattern.

In this case, all three types of training of the machine learning system 30 as mentioned above can be used (supervised learning, unsupervised learning, reinforcement learning).

In particular, during the simultaneous optimization of the partial regions 10-15 and the reconstruction of the overall image 40, the machine learning system 30 can be trained by a process in which only in each case non-reconstructed overall images 40 and a figure of merit to be optimized are input and the machine learning system 30 determines the optimal scan pattern taking account of the reconstruction of the overall image 40, and vice versa. By this means, the result of the machine learning system 30 is improved compared to separate learning processes or separate optimizations, first for determining the partial regions 10-15 and then for reconstructing the overall image 40 of the sample 1 from the scanned partial regions 10-15. This means, in particular, that compared with the mutually independent determination of the partial regions 10-15 of the sample 1 and reconstruction of the overall image 40 in the case of joint determination of the partial regions 10-15 and reconstruction of the overall image 40, e.g. less scan time is required, a small area has to be scanned, there is a lower radiation exposure of the sample and/or a more exact overall image 40 of the sample can be created.

The machine learning system 30 can be or have been implemented in terms of software on a computer, for example. In particular, the machine learning system 30 can be executed or implemented on a graphics card.

FIGS. 3-6 show various scan patterns or partial regions 10-15 of the sample 1 which are scanned by the scanning microscope, wherein the scan patterns or partial regions 10-15 were determined or calculated by the machine learning system 30.

FIG. 3 shows a first scan pattern of the sample 1 from FIG. 1 in accordance with one embodiment of the method according to the invention. In the case of this scan pattern, only one partial region 10-15 of the sample 1 or of the carrier is scanned. The partial regions 10-15 are contiguous. The sample 1 is traversed in interconnected lines spaced apart from one another. Such a scan pattern for example is determined by the machine learning system 30.

FIG. 4 shows a second scan pattern of the sample 1 from FIG. 1 in accordance with one embodiment of the method according to the invention. The black quadrilaterals show the partial regions 10-15 of the sample 1 which the machine learning system 30 determined to be the ones to be scanned by the scanning microscope. Such a scan pattern for example is determined by the machine learning system 30.

FIG. 5 shows a third scan pattern of the sample 1 from FIG. 1 in accordance with one embodiment of the method according to the invention. FIG. 4 shows an adaptive scan pattern, wherein the adaptive scan pattern is linear and, upon a changeover from the background to an element 5-8, examines the element 5-8, in particular the edges thereof, more closely by virtue of the line of the scan pattern moving back and forth a number of times over the edge of the element 5-8. Such a scan pattern for example is determined by the trained machine learning system 30.

FIG. 6 shows a fourth scan pattern of the sample 1 from FIG. 1 in accordance with one embodiment of the method according to the invention. The machine learning system 30 has determined that what is most efficient (with regard to the scan process and/or with regard to the reconstruction of the overall image 40 of the sample 1) is to traverse the sample 1 or the carrier with the sample 1 in sinusoidal lines as scan pattern.

FIG. 8 shows a schematic illustration of a further embodiment of the system 60 according to the invention for capturing partial regions 50-55 by means of a microscope, in particular by means of a wide-field microscope.

The system 60 comprises a trained machine learning system 30 configured for determining the partial regions 50-55 of the sample 1 which are captured. Moreover, it is possible for the system 60 additionally to reconstruct an overall image 40 of the sample 1 from the data 65 of the captured partial regions 50-55.

The partial regions 50-55 of the sample 1 which are captured, i.e. the capture pattern, are determined by means of a machine learning system 30. The order of the partial regions 50-55 which are captured is also determined by the machine learning system 30.

The partial regions 50-55 are captured by means of a wide-field microscope. A wide-field microscope does not scan individual points of the sample 1 (like a scanning microscope). In the case of the wide-field microscope, partial regions 50-55 are in each case illuminated or irradiated and the respective partial region 50-55 is captured by the wide-field microscope. However, typically only partial regions 50-55 of the sample 1 are illuminated or irradiated, rather than the sample 1 as a whole.

The method for capturing partial regions 50-55 of the sample 1 by means of a wide-field microscope can be configured similarly to the above-described method for capturing partial regions 50-55 of the sample 1 by means of a scanning microscope. The difference is that scanning of partial regions 50-55 does not take place, rather partial regions 50-55 of the sample 1 are captured or recorded by means of a wide-field microscope.

It is also possible that an overall image 40 of the sample 1 is captured with low resolution, then partial regions 50-55 determined by the machine learning system 30 are captured with high resolution and, finally, a high-resolution overall image 40 of the sample 1 is reconstructed from the captured partial regions 50-55 and the overall image 40 by means of the machine learning system 30. The reconstruction can be carried out by means of the machine learning system 30.

FIG. 9 shows a fifth capture pattern of the sample 1 from FIG. 1 in accordance with one embodiment of the method according to the invention.

In this case, only partial regions 50-55 of the sample 1 are captured by means of the wide-field microscope. The machine learning system 30 determines which partial regions 50-55 of the sample 1 are captured and the order in which they are captured. An overall image 40 of the sample 1 is reconstructed from the captured partial regions 50-55 of the sample 1. The reconstruction can be carried out by means of the machine learning system 30.

FIG. 10 shows a sixth capture pattern of the sample 1 from FIG. 1 in accordance with one embodiment of the method according to the invention.

Here, first of all, a fast overview image (which was recorded for example by means of a scanning microscope, in particular a laser scanning microscope or by means of an overview camera or by means of a wide-field microscope) is input into the machine learning system 30. The overview image may have a low degree of detail or a low resolution. On the basis of the overview image, the machine learning system 30 determines the partial regions 50-55 of the sample 1 which are to be captured. The determined partial regions 50-55 of the sample 1 are then captured.

The partial regions 50-55 captured by the microscope then have in each case a higher resolution (than the overview image). Alternatively or additionally, the overview image can be recorded with a different dye than the partial regions 50-55 which are captured later. The captured partial regions 50-55 form the overall image 40, which was not necessarily reconstructed, but rather in the simplest case is only constituted from the captured partial regions 50-55. In FIG. 10, all relevant information of elements of the sample 1 is captured by the partial regions 50-55 captured by the microscope. Only the relevant partial regions 50-55 of the sample 1 which are determined by the machine learning system 30 are captured with a high degree of detail.

FIG. 11 shows a seventh capture pattern of the sample 1 from FIG. 1 in accordance with one embodiment of the method according to the invention.

The next partial region 50-55 of the sample 1 which is to be captured by means of the wide-field microscope can be determined by the machine learning system 30 on the basis of the captured information of the partial region 50-55 recorded directly beforehand or of the partial regions 50-55 recorded directly beforehand. This is particularly suitable for a reinforcement learning method that determines the next partial region 50-55 to be captured from processes already carried out for capturing partial regions 50-55 and results resulting therefrom (captured partial regions 50-55).

By way of example, in this case, an edge of an element of the sample 1 can be identified or scanned by the captured partial regions 50-55. The arrows in FIG. 10 indicate the order in which the partial regions 50-55 are captured by the wide-field microscope. The regions or the edge of the element of the sample 1 between the captured partial regions 50-55 can be reconstructed by means of the machine learning system 30. It is also possible for the overall image 40 of the sample 1 to be reconstructed from the captured partial regions 50-55.

It is possible firstly for subregions of the overall image 40 to be reconstructed substantially independently of one another from the data 65 of the captured partial regions 50-55 of the sample 1, and then for the subregions to be combined to form a reconstructed overall image 40.

The system and respectively the method can be configured in such a way that, besides the captured partial regions, the overview image is also taken into account when reconstructing the overall image. The non-captured partial regions of the sample can thus be estimated on the basis of the captured partial regions and on the basis of the overview image.

It is possible for the method to be carried out iteratively. In this case, the overall image reconstructed beforehand can be used as an overview image for a renewed pass of the method. This can also be repeated. This means that the method is ran through more than twice. The system can thus also be configured to carry out the method iteratively a number of times, wherein the reconstructed overall image in one pass of the method is used or input as an overview image in the next pass of the method.

LIST OF REFERENCE SIGNS 1, 1' Sample
5-8, 5'-8' Elements
10-15, 10' Scanned partial regions of the sample
20 System for scanning partial regions of a sample by means of a scanning microscope
25 Data of the scanned partial regions
30 Machine learning system
40 Reconstructed overall image
50-55 Captured partial regions of the sample
60 System for capturing partial regions of a sample by means of a wide-field microscope
65 Data of the captured partial regions

The invention claimed is:

1. A method for capturing partial regions of a sample by a microscope the method comprising:
   determining the partial regions of the sample which are to be captured by the microscope, the partial regions determined by a machine learning system that is trained to determine the partial regions of the sample, wherein the machine learning system is trained by supervised learning, unsupervised learning, and/or reinforcement learning to determine the partial regions of the sample which are to be captured by the microscope;
   determining, by the machine learning system, a scan pattern to be used to capture the partial regions of the sample;
   determining, by the machine learning system, an order in which the partial regions are to be captured; and
   capturing the partial regions of the sample by the microscope based on the scan pattern in the order determined by the machine learning system.

2. The method as claimed in claim 1, further comprising:
   reconstructing an overall image of the sample from data of the captured partial regions of the sample, wherein non-captured partial regions of the sample are estimated by the data of the captured partial regions of the sample.

3. The method as claimed in claim 1, wherein the method further comprises training the machine learning system by reinforcement learning by:
   inputting one or more figures of merit into the machine learning system; and
   varying the partial regions of the sample which are captured and/or the order in which the partial regions of the sample are captured in order to achieve the one or more figures of merit.

4. The method as claimed in claim 1, wherein
   before the partial regions of the sample are captured, an overview image of the sample is input into the machine learning system for improved determination of the partial regions which are captured by the microscope.

5. The method as claimed in claim 4, wherein the method further comprises: reconstructing an overall image of the sample from data of the captured partial regions of the sample and the overview image.

6. The method as claimed in claim 4, wherein,
   the overview image comprises a reconstructed overall image of the sample.

7. The method as claimed in claim 1, wherein the method further comprises training the machine learning system by unsupervised learning by:
   inputting non-reconstructed overall images of samples into the machine learning system; and
   determining the partial regions of the sample which have a high information density on the basis of the respective non-reconstructed overall image by an autoencoder for improved determination of the partial regions of the sample which are captured by the microscope.

8. A method for capturing partial regions of a sample by a microscope and for reconstructing an overall image of the sample from data of the captured partial regions of the sample, the method comprising:
   determining the partial regions of the sample which are to be captured by the microscope by a machine learning system;
   determining, by the machine learning system, a scan pattern to be used to capture the partial regions of the sample;
   determining, by the machine learning system, an order in which the partial regions are to be captured;
   capturing the partial regions of the sample by the microscope using the scan pattern in the order determined by the machine learning system;
   inputting data of the captured partial regions into the machine learning system; and
   reconstructing an overall image of the sample from the data of the captured partial regions of the sample by the machine learning system, wherein non-captured partial regions of the sample are estimated of the data of the captured partial regions of the sample by the machine learning system, and wherein the machine learning system is trained by supervised learning, unsupervised learning, and/or a reinforcement learning for improved reconstruction of the reconstructed overall image of the sample from the data of the captured partial regions of the sample.

9. The method as claimed in claim 8, wherein the method further comprises training the machine learning system for improved reconstruction of the reconstructed overall image from the data of the captured partial regions of the sample by supervised learning by:
   inputting data of captured partial regions of the sample as training data into the machine learning system; and
   comparing the overall image of the sample that is reconstructed from the training data by the machine learning system with a non-reconstructed overall image of the sample for training the machine learning system for improved reconstruction of the overall image from the data of the captured partial regions of the sample.

10. The method as claimed in claim 8, further comprising: training the machine learning system in an optimization process simultaneously for improved determination of the partial regions of the sample which are captured by the microscope and for improved reconstruction of the reconstructed overall image from the captured partial regions of the sample.

11. A non-transitory computer-readable medium storing instructions which are readable by a processor of a computer and which, when they are executed by the processor, cause the processor to carry out the method as claimed in claim 1.

12. A system for capturing partial regions of a sample by a microscope, wherein the system comprises:
- a machine learning system which, by supervised learning, unsupervised learning, and/or reinforcement learning, is trained to determine the partial regions of the sample which are to be captured by the microscope, wherein the machine learning system:
  - determines a scan pattern to be used to capture the partial regions of the sample;
  - determines an order in which the partial regions are to be captured; and
  - captures the partial regions of the sample by the microscope based on the scan pattern in the order determined by the machine learning system.

13. The system as claimed in claim 12, wherein the system is configured for reconstructing an overall image of the sample from data of the captured partial regions of the sample, and wherein the machine learning system or another machine learning system is configured for estimating non-captured partial regions of the sample by the data of the captured partial regions of the sample.

14. A system for capturing partial regions of a sample by a microscope, and for reconstructing an overall image of the sample from data of the captured partial regions of the sample, wherein the system comprises:
- a machine learning system which, by supervised learning, unsupervised learning, and/or reinforcement learning, is trained to:
  - determine the partial regions of the sample;
  - determine a scan pattern to be used to capture the partial regions of the sample;
  - determine an order in which the partial regions are to be captured; and
  - capture the partial regions of the sample by the microscope based on the scan pattern in the order determined by the machine learning system; and
  - reconstruct an overall image of the sample from data of the captured partial regions of the sample by the machine learning system, wherein non-captured partial regions of the sample are estimated by the data of the captured partial regions of the sample by the machine learning system.

15. The system as claimed in claim 12, wherein the machine learning system is trained in an optimization process simultaneously for improved determination of the partial regions of the sample which are captured by the microscope and for improved reconstruction of an overall image of the sample from the captured partial regions of the sample.

16. The method as claimed in claim 1, wherein the microscope is a scanning microscope.

17. The method as claimed in claim 8, wherein the microscope is a scanning microscope.

18. The system as claimed in claim 12, wherein the microscope is a scanning microscope.

19. The system as claimed in claim 14, wherein the microscope is a scanning microscope.

* * * * *

UNITED STATES PATENT AND TRADEMARK OFFICE
CERTIFICATE OF CORRECTION

PATENT NO. : 12,235,428 B2
APPLICATION NO. : 17/059343
DATED : February 25, 2025
INVENTOR(S) : Daniel Haase and Manuel Amthor It is certified that error appears in the above-identified patent and that said Letters Patent is hereby corrected as shown below:

On the Title Page

On Page 2, under Item (56) OTHER PUBLICATIONS, Column 2, Line 6 currently reads:
"Microscope"
And should read:
--Microscopy--;

On Page 2, under Item (56) OTHER PUBLICATIONS, Column 2, Line 19 currently reads:
"IFEE"
And should read:
--IEEE--;

On Page 2, under Item (56) OTHER PUBLICATIONS, Column 2, Line 23 currently reads:
"IFEE"
And should read:
--IEEE--;

In the Specification

Column 1, under CROSS-REFERENCE TO RELATED APPLICATIONS, Line 10 currently reads:
"§ 371"
And should read:
--§371--;

Column 1, under CROSS-REFERENCE APPLICATIONS, Line 11 currently reads:
"PCT/EP2019%064023"
And should read:
--PCT/EP2019/064023--;

Signed and Sealed this
Twenty-ninth Day of July, 2025

Coke Morgan Stewart
*Acting Director of the United States Patent and Trademark Office*

Column 4, Line 37 currently reads:
"the the"
And should read:
--the--;

Column 5, Line 3 currently reads:
"the the"
And should read:
--the--;

Column 11, Line 9 currently reads:
"the the"
And should read:
--the--;

Column 11, Line 20 currently reads:
"particulary"
And should read:
--particularly--;

Column 11, Line 38 currently reads:
"the the"
And should read:
--the--;

Column 16, Line 53 currently reads:
"invention:"
And should read:
--invention;--;

Column 16, Line 56 currently reads:
"invention:"
And should read:
--invention;--;

Column 16, Line 64 currently reads:
"invention:"
And should read:
--invention;--;

Column 18, Line 37 currently reads:
"40."
And should read:
--40,--;

CERTIFICATE OF CORRECTION (continued)
U.S. Pat. No. 12,235,428 B2

In the Claims

Column 25, in Claim 1, Line 42 currently reads:
"microscrope"
And should read:
--microscope,--.